United States Patent
Patil et al.

(10) Patent No.: US 10,996,300 B2
(45) Date of Patent: May 4, 2021

(54) CARTESIAN-RADIAL HYBRID K-SPACE TRAJECTORY FOR VOLUMETRIC IMAGING

(71) Applicants: Siemens Healthcare GmbH, Erlangen (DE); University of Utah Research Foundation, Salt Lake City, UT (US)

(72) Inventors: Sunil Goraksha Patil, Ellicott City, MD (US); Henrik Odeen, Salt Lake City, UT (US); Dennis L. Parker, Centerville, UT (US)

(73) Assignees: Siemens Healthcare GmbH, Erlangen (DE); University of Utah Research Foundation, Salt Lake City, UT (US)

( * ) Notice: Subject to any disclaimer, the term of this patent is extended or adjusted under 35 U.S.C. 154(b) by 122 days.

(21) Appl. No.: 16/121,738

(22) Filed: Sep. 5, 2018

(65) Prior Publication Data

US 2020/0072928 A1 Mar. 5, 2020

(51) Int. Cl.
*G01R 33/48* (2006.01)
*G01R 33/561* (2006.01)
*G01R 33/56* (2006.01)

(52) U.S. Cl.
CPC ..... *G01R 33/4826* (2013.01); *G01R 33/4822* (2013.01); *G01R 33/5602* (2013.01); *G01R 33/5616* (2013.01)

(58) Field of Classification Search
CPC ............ G01R 33/4826; G01R 33/4824; G01R 33/4822; G01R 33/482; G01R 33/4818;

(Continued)

(56) References Cited

U.S. PATENT DOCUMENTS 7,254,437 B2 * 8/2007 Miyazaki ............... A61B 5/055
324/307
7,359,745 B2 * 4/2008 Lewin .................. G01R 33/022
324/312

(Continued)

OTHER PUBLICATIONS

Gradel, Nadine N., Three-Dimensional Hybrid Radial Cartesian Echo Planar Imaging for Functional MRI. Lincoln College University of Oxford. A thesis submitted for the degree of Doctor of Philosophy (Year: 2016).*

(Continued)

*Primary Examiner* — Dixomara Vargas
*Assistant Examiner* — Sean Curtis

(57) ABSTRACT

An MRI system uses a Cartesian-radial hybrid k-space trajectory to capture three-dimensional k-space data and reconstruct an image of an area of interest of a subject. The MRI system performs a series of k-space acquisitions to collect the data. A first k-space acquisition includes acquiring a two-dimensional EPI projection in a first plane parallel to a frequency-encoding direction and acquiring additional two-dimensional EPI projections in planes that are radially shifted about a center axis parallel to the frequency-encoding direction with respect to the first plane, until a selected number of projections are acquired. Each subsequent k-space acquisition includes acquiring an additional set of two-dimensional EPI projections in all of the planes in which an EPI projection was acquired during the first k-space acquisition, each additional set of EPI projections being shifted along a respective plane in a direction perpendicular to the frequency-encoding direction.

17 Claims, 7 Drawing Sheets

(58) Field of Classification Search
CPC .............. G01R 33/561; G01R 33/5602; G01R 33/5616; G01R 33/56554; G01R 33/5615
USPC .................................................. 324/300–322
See application file for complete search history.

(56) References Cited

U.S. PATENT DOCUMENTS

| | | | | |
|---|---|---|---|---|
| 7,898,254 | B2* | 3/2011 | Feinberg | G01R 33/56366 |
| | | | | 324/309 |
| 7,949,384 | B2* | 5/2011 | Lewin | G01R 33/022 |
| | | | | 324/306 |
| 8,131,338 | B2* | 3/2012 | Kassai | A61B 5/055 |
| | | | | 600/407 |
| 8,560,049 | B2* | 10/2013 | Kassai | A61B 5/055 |
| | | | | 600/407 |
| 8,706,190 | B2* | 4/2014 | Gross | G01R 33/4804 |
| | | | | 324/307 |
| 9,078,589 | B2* | 7/2015 | Kassai | A61B 5/055 |
| 9,581,671 | B2* | 2/2017 | Dannels | G01R 33/56554 |
| 9,640,070 | B2* | 5/2017 | Griswold | G08C 23/06 |
| 10,288,703 | B2* | 5/2019 | Li | G01R 33/5617 |
| 10,353,034 | B2* | 7/2019 | Bolster, Jr. | G01R 33/5615 |
| 10,429,470 | B2* | 10/2019 | Pfeuffer | G01R 33/4828 |
| 10,481,232 | B2* | 11/2019 | Miyazaki | G01R 33/482 |
| 10,677,866 | B1* | 6/2020 | Rinott | A61N 7/02 |
| 2005/0065429 | A1* | 3/2005 | Zhou | G01R 33/4804 |
| | | | | 600/412 |
| 2008/0292167 | A1* | 11/2008 | Todd | G01R 33/4804 |
| | | | | 382/131 |
| 2009/0212773 | A1* | 8/2009 | Feinberg | G01R 33/5618 |
| | | | | 324/309 |
| 2014/0296702 | A1* | 10/2014 | Griswold | A61B 5/0017 |
| | | | | 600/416 |
| 2015/0241537 | A1* | 8/2015 | Dannels | G01R 33/56554 |
| | | | | 324/309 |
| 2015/0301136 | A1* | 10/2015 | Li | G01R 33/5608 |
| | | | | 324/309 |
| 2017/0322274 | A1* | 11/2017 | Bolster, Jr. | G01R 33/4804 |
| 2018/0074148 | A1* | 3/2018 | Pfeuffer | G01R 33/5608 |
| 2018/0120396 | A1* | 5/2018 | Weiss | G01R 33/4804 |
| 2018/0299525 | A1* | 10/2018 | Miyazaki | G01R 33/5605 |
| 2019/0369199 | A1* | 12/2019 | Setsompop | G01R 33/5676 |
| 2020/0072928 | A1* | 3/2020 | Patil | G01R 33/5602 |
| 2020/0166593 | A1* | 5/2020 | Rinott | G01R 33/4814 |

OTHER PUBLICATIONS

Kim et al., Free-breathing cardiac 3D cine MRI at 3T using golden-ratio Cartesian radial sampling and variable flip angle. 1Electrical Engineering, Univ. of Southern California, Proc. Inti. Soc. Mag. Reson. Med. 22 (2014) (Year: 2014).*

Graveron-Demilly et al., MRI of Material with Short Relaxation Times using Cartesian Radial Scanning. 18th Annual International Conference of the IEEE Engineering in Medicine and Biology Society, Amsterdam 1996 (Year: 1996).*

Gradel et al., Motion Correction for Functional MRI With Three-Dimensional Hybrid Radial-Cartesian EPI. Magnetic Resonance in Medicine 78:527-540 (2017) (Year: 2017).*

* cited by examiner

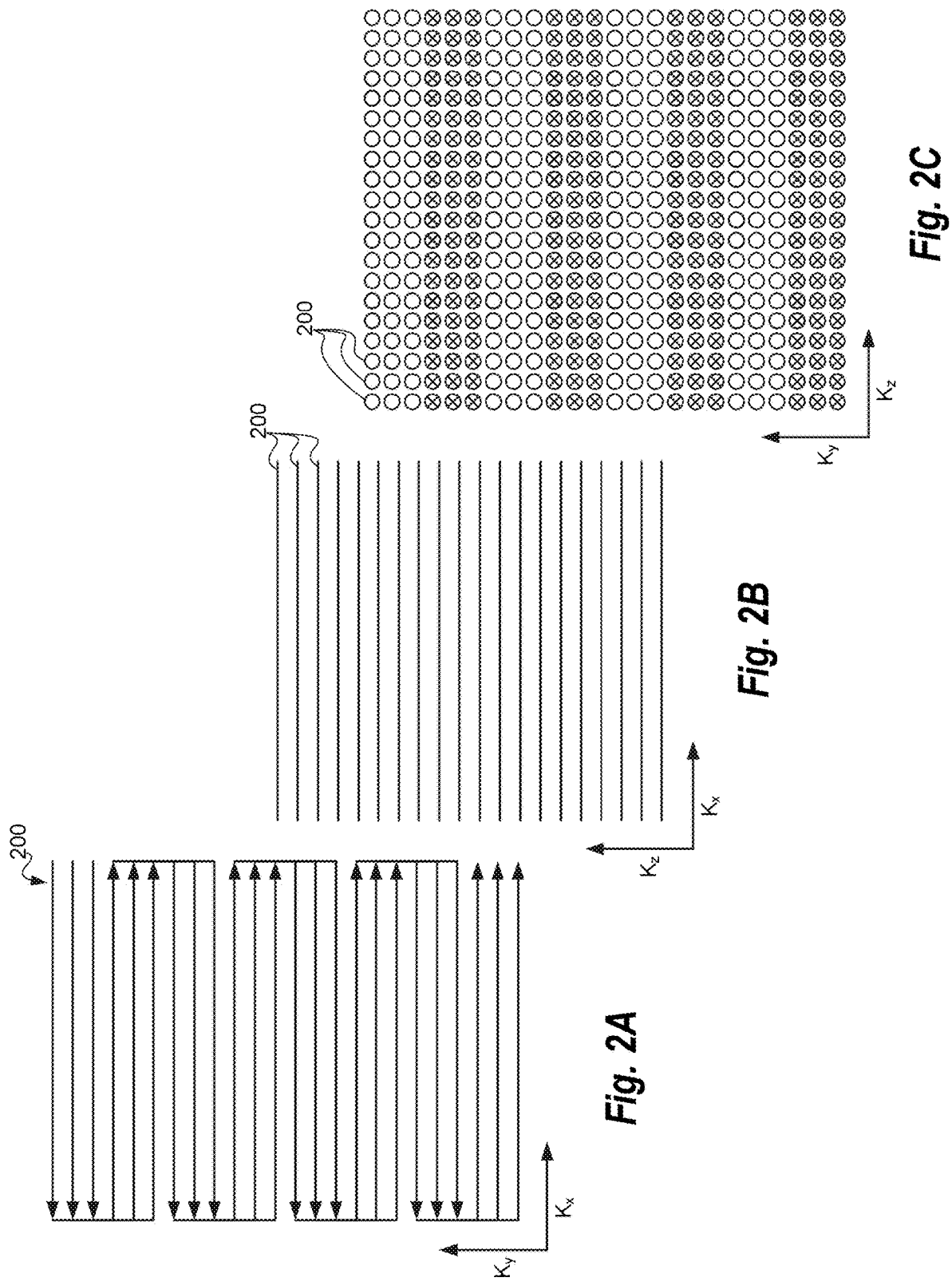

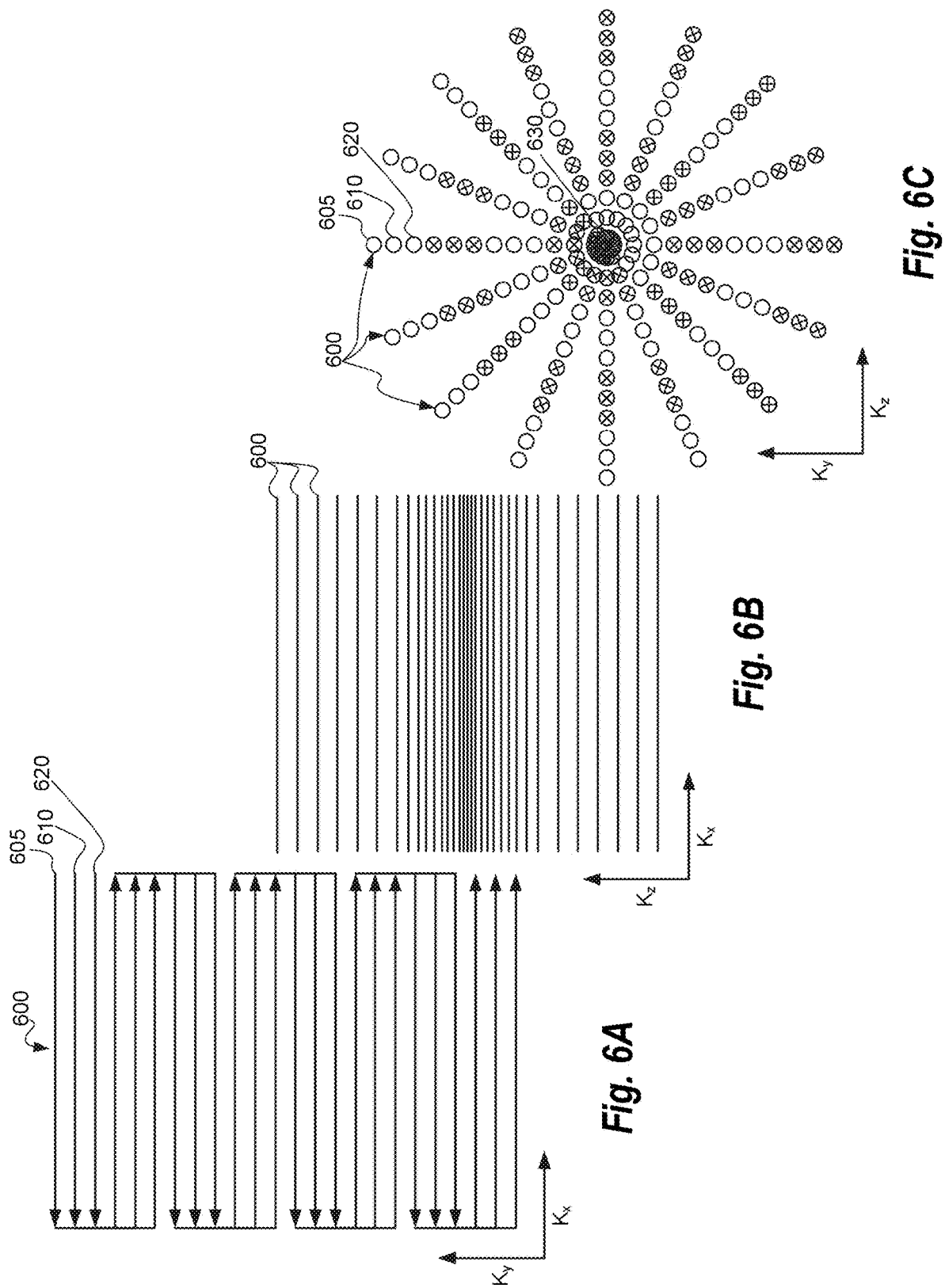

CARTESIAN-RADIAL HYBRID K-SPACE TRAJECTORY FOR VOLUMETRIC IMAGING

TECHNICAL FIELD

The present invention relates generally to k-space trajectories for data sampling in Magnetic Resonance Imaging (MRI) and, more particularly, to a Cartesian-radial hybrid k-space trajectory for volumetric imaging.

BACKGROUND

Magnetic resonance (MR) imaging has become a common diagnostic technique with many applications. For example, MR imaging provides excellent soft tissue contrast when used to guide focused ultrasound (FUS) thermal therapy procedures, providing the ability to localize, plan, monitor and verify treatments. FUS has been used to non-invasively treat uterine fibroids as well as breast, prostate, liver and brain cancer.

As FUS can deliver large amounts of energy over a short time interval, temperature monitoring of treatments requires an MRI process with a high temporal resolution. Also, because the energy is delivered from a large transducer aperture to a small focus, a large field of view is required to monitor any possible energy deposition. The FUS beam will likely travel through several different tissue types during treatment where a portion of the beam will be reflected and transmitted at each tissue interface depending on the impedance difference between the tissues. Therefore, for temperature monitoring during thermal therapy, as with other MRI applications, the chosen MR system and method should be designed to satisfy certain characteristics that enable the procedure to be medically reliable.

For instance, temperature monitoring can be done using 2D or 3D MRI sequences where the method chosen is often governed by the trade-off between the needed temporal and spatial resolution and required field of view. MRI temperature imaging limitations are more apparent when using 2D imaging. Partial volume effects may cause an underestimation of the actual temperature, which will increase with voxel size. It can also be difficult to properly position a single 2D slice to capture the entire focus. Multiple 2D slices will have a gap between each slice, meaning any temperature increase in the gap will not be measured. Respiration and motion artifacts will also introduce errors to the temperature monitoring.

3D MR thermometry can overcome many of the field of view, partial volume, and coverage gap limitations, which are inherent in 2D imaging. For example, a segmented 3D Echo Planar Imaging (EPI) sequence has shown to be a reliable method for various MRI applications, including thermal monitoring, functional MRI (fMRI), etc. The 3D EPI sequence is a volumetric imaging method that can be used to cover the entire underlying organ such as brain, prostate, breast, or liver, in order to create images, monitor temperature changes as a consequence of proton resonance frequency shift, perform fMRI, etc.

Many of the variables in MR imaging, including temporal resolution, are related to the k-space trajectory used to capture data during the procedure. In the segmented 3D EPI procedure mentioned above, k-space is captured using Cartesian trajectories in three dimensions that are segmented in order to provide T2*-weighting (the segmenting of the trajectories allows the time to echo (TE) to be on the order of T2*-weighting). T2*-weighted imaging has become an essential clinical tool in the neuro domain to visualize blood vessels, hemorrhage, calcifications, and iron deposits in the brains of people with neurological disorders such as multiple sclerosis (MS) and traumatic brain injury (TBI). The segmented 3D EPI approach with all Cartesian trajectories has produced effective results, including maintaining T2*-weighting, in some applications, but may be less than ideal in certain situations, especially with respect to thermometry. For example, temporal resolution may be lacking using this approach because the k-space is traversed across (e.g., side to side) the volume in all directions.

The present disclosure is directed to modified MRI processes and associated systems that overcome some of the drawbacks of the current options and provide a more efficient imaging and thermal monitoring solution.

SUMMARY

Embodiments of the present invention address and overcome one or more of the above shortcomings and drawbacks, by providing methods, systems, and apparatuses related to k-space trajectories for volumetric imaging.

In an exemplary embodiment, a computer-implemented method for generating an image of a subject using a magnetic resonance imaging (MRI) system using a hybrid Cartesian-radial k-space trajectory is disclosed. The method includes sampling k-space to obtain three-dimensional k-space data related to an area of interest of the subject and reconstructing the three-dimensional k-space data into an image of the area of interest. Sampling k-space includes performing a first k-space acquisition followed by at least one subsequent k-space acquisition. The first k-space acquisition includes acquiring a two-dimensional echo planar imaging (EPI) projection in a first plane parallel to a frequency-encoding direction and acquiring additional two-dimensional EPI projections in planes that are radially shifted about a center axis parallel to the frequency-encoding direction with respect to the first plane, until a selected number of projections are acquired. Each subsequent k-space acquisition includes acquiring an additional set of two-dimensional EPI projections in all of the planes in which an EPI projection was acquired during the first k-space acquisition. Each additional set of EPI projections is shifted within a respective plane with respect to any previous projections acquired in that plane.

In another exemplary embodiment, a system for performing magnetic resonance imaging (MRI) of a subject using a hybrid Cartesian-radial k-space trajectory is disclosed. The MRI system includes a plurality of imaging coils including a plurality of gradient coils, and a plurality of radio-frequency (RF) coils. The MRI system further includes a central control computer. The central control computer is configured to sample k-space to obtain three-dimensional k-space data related to an area of interest of the subject and reconstruct the three-dimensional k-space data into an image of the area of interest. Sampling k-space includes performing a first k-space acquisition followed by at least one subsequent k-space acquisition. The first k-space acquisition includes acquiring a two-dimensional echo planar imaging (EPI) projection in a first plane parallel to a frequency-encoding direction and acquiring additional two-dimensional EPI projections in planes that are radially shifted about a center axis parallel to the frequency-encoding direction with respect to the first plane, until a selected number of projections are acquired. Each subsequent k-space acquisition includes acquiring an additional set of two-dimensional EPI projections in all of the planes in which an EPI projection was acquired during the first k-space acquisition. Each additional set of EPI projections is shifted within a respective plane with respect to any previous projections acquired in that plane.

In yet another embodiment, a computer-implemented method for temperature monitoring of a subject through magnetic resonance imaging (MRI) is disclosed. The method includes creating a baseline temperature measurement by sampling k-space to obtain three-dimensional k-space data related to an area of interest of the subject and performing a temperature monitoring procedure. Creating the baseline temperature measurement includes performing a series of k-space acquisitions in which two-dimensional EPI projections extending parallel to a frequency-encoding direction are acquired in a plurality of respective radially-offset planes during each acquisition, and each of the projections in common planes are offset from each other within the respective common plane. Creating the baseline temperature measurement further includes calculating a first proton resonance frequency value for each coordinate making up each of the projections. The temperature-monitoring procedure includes repeating the series of k-space acquisitions, and after each k-space acquisition: calculating a second proton resonance frequency value for each coordinate making up each of the projections acquired during that acquisition, comparing the second proton resonance frequency value to the first proton resonance frequency value for each coordinate, and generating a temperature difference map based on the comparison.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures:

FIG. 2A is a first view of a Cartesian k-space EPI trajectory, consistent with some of the disclosed embodiments;

FIG. 2B is a second view of a Cartesian k-space EPI trajectory, consistent with some of the disclosed embodiments;

FIG. 2C is a third view of a Cartesian k-space EPI trajectory, consistent with some of the disclosed embodiments;

FIG. 6A is a first view of a hybrid Cartesian-radial k-space EPI trajectory, consistent with some of the disclosed embodiments;

FIG. 6B is a second view of a hybrid Cartesian-radial k-space EPI trajectory, consistent with some of the disclosed embodiments;

FIG. 6C is a third view of a hybrid Cartesian-radial k-space EPI trajectory, consistent with some of the disclosed embodiments;

DETAILED DESCRIPTION

The present disclosure describes systems and method for MRI and related applications. In an embodiment, an MRI system uses a Cartesian-radial hybrid k-space trajectory to capture data using 3-D Echo Planar Imaging (EPI). The MRI system acquires data in the $K_x$-$K_y$ and $K_x$-$K_z$ directions using a Cartesian trajectory and acquires data in the $K_y$-$K_z$ direction using a radial trajectory. For example, a 2D projection may be generated using a Cartesian approach in a $K_x$-$K_y$ plane. That 2D projection may then be repeated after a radial shift, for example using a golden angle increment. By also shifting in the $K_y$-$K_z$ direction, the entire 3D k-space can be filled efficiently. This hybrid approach takes advantage of some benefits associated with Cartesian and radial trajectories. For example, the use of a Cartesian trajectory along the $K_x$-$K_y$ direction allows for a segmented approach that provides effective T2*-weighting. The radial trajectory along the $K_y$-$K_z$ direction offers rapid and efficient 3D coverage.

The hybrid Cartesian-radial trajectory for data acquisition is also well suited in thermometry applications because of the quicker temporal resolution in comparison to the all-Cartesian sequence. For instance, the disclosed k-space trajectory lends itself well to temperature difference monitoring using sliding window (also known as view-sharing) type reconstruction. A temperature monitoring procedure may include first acquiring a 3D k-space baseline using the hybrid trajectory. After thermal therapy is initiated, the hybrid sequence may again commence, with each set of 2D projections representing a new point in time that can be compared to the baseline. Because the 2D projections are centered around a point and are shifted radially, the entire volume is captured quickly, with particularly good image resolution around the center. As the MR sequence continues, a new set of projections, shifted in the $K_y$-$K_z$ plane, provide another opportunity to compare to the baseline.

Another application of the hybrid Cartesian-Radial k-space trajectory is in reducing artifacts in MRI by estimating and correcting motion parameters after each set of 2D projections is captured. For example in blood-oxygen-level dependent (BOLD) fMRI, consecutive 3D volumes captured using the hybrid trajectory can be used to estimate motion parameters and adjust as necessary. In another example, the hybrid trajectory EPI sequence can be used in high resolution structural imaging (e.g., MS, Susceptibility Weighted Imaging (SWI), TBI applications) by co-registering individual low-resolution volumes to mitigate motion and thereby help to avoid blurring in the images.

Figure 1:
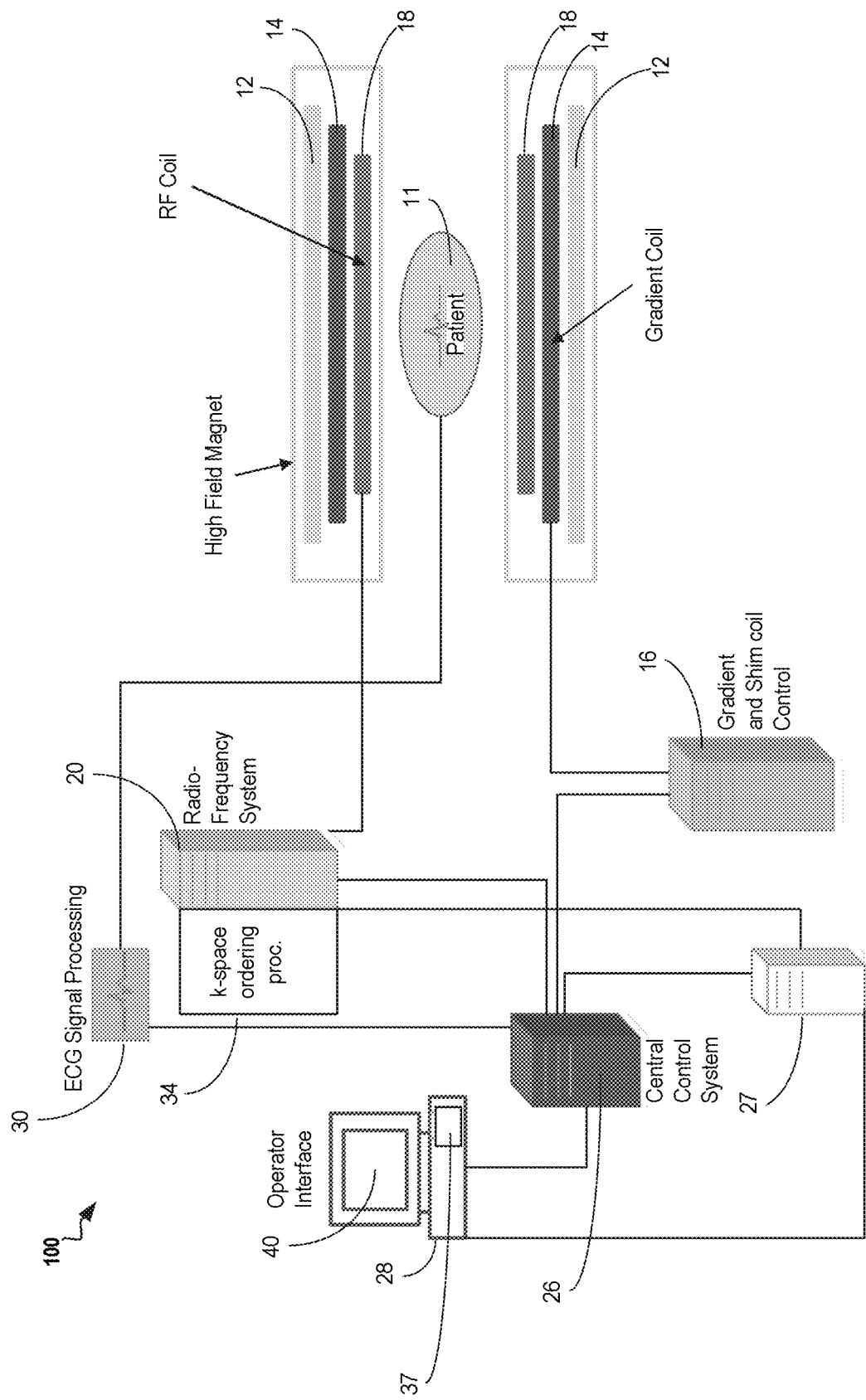
FIG. 1 is a schematic diagram of an exemplary MRI system, consistent with some of the disclosed embodiments.

FIG. 1 shows a system 100 for ordering acquisition of frequency domain components representing MR data for storage in a k-space storage array, as used by some embodiments of the present invention. The system 100 is an example of an MRI system configured to perform an echo planar imaging (EPI) sequence in order to collect MR data that may be used in imaging or other applications. For example, the system 100 may be used in conjunction with a thermal therapy system, such as a focused ultrasound (FUS) treatment, in order to monitor temperature of an imaged/treated organ by way of the collected MR data. Other examples of thermal therapies that the disclosed system 100 may be used in conjunction with include laser ablation, micro wave ablation, radio frequency ablation, and cryoablation.

In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generate magnetic field gradient pulses for magnetic resonance imaging pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Radio frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control system 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space ordering processor unit 34 to provide a magnetic resonance dataset to an image data processor for processing into an image. In some embodiments, the image data processor is located in central control system 26. However, in other embodiments such as the one depicted in FIG. 1, the image data processor is located in a separate unit 27. Electrocardiogram (ECG) signal processing 30 provides ECG signals used for pulse sequence and imaging synchronization. A two or three dimensional k-space storage array of individual data elements in k-space ordering processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field and a sequence of gradient (coils 14) and RF (coil 18) pulses for use in acquiring multiple individual frequency components corresponding to individual data elements in the storage array. The individual frequency components are successively acquired, for example, using the hybrid Cartesian-radial imaging trajectory disclosed. A storage processor in the k-space ordering processor unit 34 stores individual frequency components acquired using the magnetic field in corresponding individual data elements in the array. The magnetic field acquires individual frequency components in an order corresponding to a sequence of substantially adjacent individual data elements in the array and magnetic field gradient change between successively acquired frequency components which is substantially minimized.

In one embodiment, central control system 26 uses information stored in an internal database to process the detected magnetic resonance signals in a coordinated manner to generate high quality images of a selected slice(s) of the body (e.g., using the image data processor) and adjusts other parameters of system 100. In another embodiment, the central control system 26 produces a temperature monitoring image that represents a relative or absolute temperature of the underlying area. The stored information comprises predetermined pulse sequence and magnetic field gradient and strength data as well as data indicating timing, orientation and spatial volume of gradient magnetic fields to be applied in imaging. Generated images may be presented on display 40 of the operator interface. Computer 28 of the operator interface includes a graphical user interface (GUI) enabling user interaction with central control system 26 and enables user modification of magnetic resonance imaging signals in substantially real time. Continuing with reference to FIG. 1, display processor 37 processes the magnetic resonance signals to reconstruct one or more images for presentation on display 40, for example. Various techniques may be used for reconstruction.

There are a number of parameters which must be set for MRI system 100 to perform an imaging sequence. These parameters include time-to-echo (TE), number of echoes per echo-train (also called turbo-factor (TF) or echo-train-length (ETL)), and time-to-repeat (TR). MRI system 100 can perform sequences according to parameter values selected based on the desired imaging results and characteristics. For example, different MRI sequences can be configured for T1, T2, and/or T2* image contrast (T1-, T2-, or T2*-weighting, respectively), depending on the selected parameters, as is known in the art. T2* weighting is particularly useful in certain situations, including, for example, susceptibility-weighted imaging and fMRI.

FIGS. 2A, 2B, and 2C include various views of an example Cartesian k-space trajectory for sampling data in a three-dimensional space associated with an area of interest of a subject (e.g., patient 11 in FIG. 1). The views cover a portion of k-space, which include a frequency-encoding axis ($K_x$), a phase-encoding axis ($K_y$), and a slab-encoding axis ($K_z$). FIG. 2A is a view of $K_x$-$K_y$ plane, FIG. 2B is a view of a $K_x$-$K_z$ plane, and FIG. 3 is a view of a $K_z$-$K_y$ plane.

FIGS. 2A, 2B, and 2C illustrate a filled or sampled k-space, after a data acquisition process is complete. The three-dimensional k-space is filled with a plurality of two-dimensional samples 200. Each two-dimensional sample 200 is a preferably collected using echo planar imaging (EPI). As is known in the art, two-dimensional EPI creates a zig-zag pattern that collects data (i.e., frequency and phase) in a plane at a particular slab location (i.e., the location along the slab-encoding axis $K_z$). The pattern is shown in FIG. 2A. As will be described, each sample 200 may be formed of a plurality of overlapping projections (e.g., each sample 200 may be a segmented EPI trajectory). The term "projection" is used as a convention but may also be referred to as an echo, echo train, trajectory, or another term in the art representing data collected during a single RF excitation pulse.

Each sample 200 includes data collected for a particular two-dimensional plane within k-space. In order to fill the slab-encoding dimension ($K_z$), the MRI system 100 shifts the signal in the $K_z$ direction to a new slab location and repeats the process of collecting k-space data through the two-dimensional sample 200. FIG. 2C shows how the plurality of two-dimensional samples 200 are stacked next to each other to fill the 3-D space.

Figure 3A:
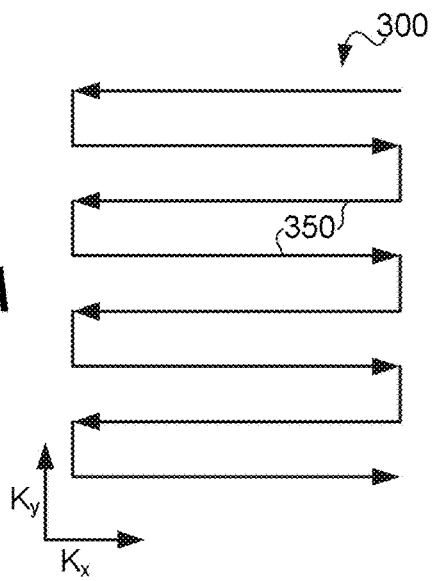
FIG. 3A is a first view of a two-dimensional EPI projection, consistent with some of the disclosed embodiments.
Figure 3B:
FIG. 3B is a second view of the two-dimensional EPI projection of FIG. 3A, consistent with some of the disclosed embodiments.

FIGS. 3A and 3B illustrate a single k-space data sampling projection 300. The MRI system 100 is configured to perform an EPI k-space data acquisition to traverse a selected plane parallel to the frequency-encoding direction (e.g., $K_x$). The result is the planar projection 300 that includes a plurality of coordinates that each fall within the two-dimensional plane. The zig-zag pattern of the projection quickly collects data for each coordinate based on either a single or small number of RF excitation pulses.

As shown in FIG. 3A, the sampling projection 300 includes traversals 350 in the $K_x$ direction. These traversals 300 are spaced from each other, with the space being determined in part by the amplitude of a phase-encoding gradient pulse applied to the area being imaged. The fewer the traversals 300, the faster the MRI system 100 is able to collect the data associated with the projection 300. However, the gap between the traversals 300 increases as fewer traversals 300 are used. In other words, image resolution is sacrificed for temporal resolution, and vice versa. These gaps are filled by using a segmented EPI approach that interleaves additional projections in a common plane with the projection 300.

Figure 4A:
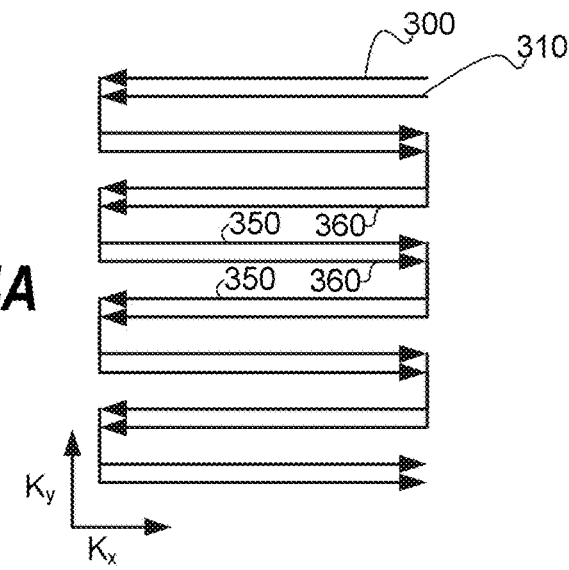
FIG. 4A is a first view of the two-dimensional EPI projection of FIG. 3A and an offset two-dimensional EPI projection, consistent with some of the disclosed embodiments.
Figure 4B:
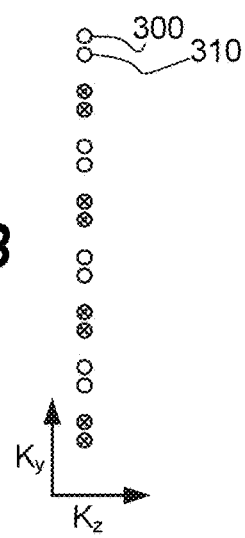
FIG. 4B is a second view of the two-dimensional EPI projections of FIG. 4A, consistent with some of the disclosed embodiments.
Figure 5A:
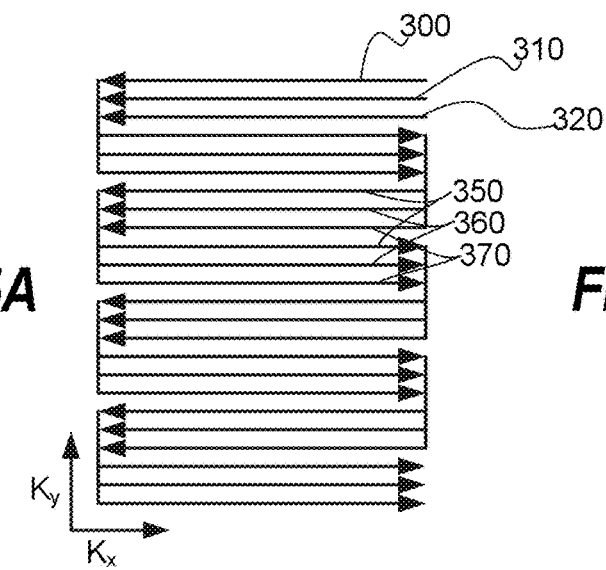
FIG. 5A is a first view of the two-dimensional EPI projections of FIG. 4A and an additional offset two-dimensional EPI projection, consistent with some of the disclosed embodiments.
Figure 5B:
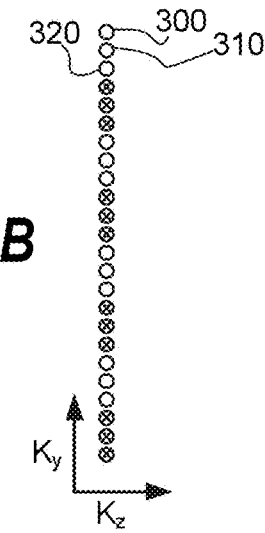
FIG. 5B is a second view of the two-dimensional EPI projections of FIG. 5A, consistent with some of the disclosed embodiments.

FIGS. 4A and 4B illustrate a projection 310 that is used to collect additional data within the same plane that has the projection 300. The MRI system 100 may shift within the plane a specified distance in order to generate the projection 310. The shift within the plane results in the projection 310 including traversals 360 that extend in the $K_x$ direction at planar locations between the traversals 350. The projection 310 thereby includes new coordinates that enhance image resolution. FIGS. 5A and 5B illustrate a further projection 320 having traversals 370. The traversals 370 are interposed between the traversals 350, 360. As shown in FIGS. 5A and 5B, the three projections 300, 310, 320 provide efficient coverage of the selected plane.

The two-dimensional EPI projections 300, 310, 320 are overlapped within a common plane in order to provide good spatial resolution to the data collected in the plane, while dividing the projections into different steps allows for separate, quick collection of low-resolution data that encompasses an large portion of the boundary. The projections 300, 310, 320 can be customized to provide a selected spacing between the traversals 350, 360, 370. Moreover, a different number of projections may be used to acquire all of the data in the sample 200, such as two, four, five, etc. The overlapping of the two-dimensional EPI projections is an example of a segmented EPI approach. The segmented EPI approach is configured to provide a TE that is on the order of T2*-weighting.

In a Cartesian-only three-dimensional k-space trajectory, the samples 200 are stacked next to each other to fill the slab-encoding direction of k-space. This is shown in FIGS. 2B and 2C. In some embodiments, the MRI system 100 shifts in the slab-encoding direction ($K_z$) to stack the samples 200 after an entire sample 200 is acquired (e.g., all of projections 300, 310, 320). In another embodiment, the MRI system 100 may acquire all of the "first" projections 300 first by shifting in the $K_z$ direction after each projection 300. After each projection 300 is captured across the entire $K_z$ dimension, the MRI system 100 shifts in the $K_y$ direction and begins collecting the projections 310. After the projections 310 are collected, the MRI system 100 shifts in the $K_y$ direction again and captures the projections 320. The Cartesian-only three-dimensional trajectory is useful for filling all of the k-space, but lacks an efficient balance of spatial and temporal resolution in some instances.

FIGS. 6A, 6B, and 6C are views of a hybrid Cartesian-radial k-space three-dimensional trajectory. The hybrid approach provides a different sequence for filling k-space using the same or similar two-dimensional EPI samples 200 illustrated in FIGS. 2A, 2B, and 2C and used in the Cartesian-only approach. In the hybrid approach, a plurality of two-dimensional "spokes" 600 (equivalent to the samples 200) are acquired in planes that are parallel to the frequency-encoding axis ($K_x$). The spokes 600 and the planes containing them are shifted in a radial direction with respect to each other while maintaining a parallel orientation to the $K_x$ axis. Each spoke 600 may include a plurality of overlapping projections 605, 610, 620, much like the projections 300, 310, 320. The MRI system 100 may be configured to perform a two-dimensional EPI k-space acquisition in order to collect each projection 605, 610, 620. The MRI system 100 may be further configured to perform radial shifts in the phase-encoding ($K_y$) and slab-encoding ($K_z$) directions to fill the three-dimensional k-space.

FIG. 6C illustrates an example of a radial shift of the two-dimensional EPI spokes 600. The planes containing the EPI spokes 600 are rotated about a central axis 630. The central axis is parallel to the frequency-encoding direction ($K_x$). The radial approach creates a concentrated central area of data collection, thereby increasing the spatial resolution near the central axis 630. While equal radial shifts are shown in FIG. 6C, other options are possible. For example, the MRI system 100 may use a golden angle radial shift for each subsequent spoke 600 in the acquisition sequence.

The radial shift of the EPI spokes 600 about the central axis 630 provides circular coverage of a generally cylindrical volume. A golden angle radial shift, with a sufficient number of spokes 600, provides substantially uniform circular coverage of the area of interest of the subject. This is known as an isotropic FOV. However, it is not necessary that the coverage be uniform in all embodiments. For example, the EPI spokes may be arranged with a large grouping of spokes 600 near a direction in the $K_y$-$K_z$ plane in order to utilize an anisotropic FOV. The anisotropic FOV option provides more elliptical coverage (due to the grouping of spokes) that may enhance spatial and temporal resolution in the elliptical area. Because many areas of interest can be viewed entirely or almost entirely within an elliptical area (e.g., a subject's brain), the anisotropic FOV may be more efficient and useful in certain situations. With any selected radial shift (e.g., golden angle, equal, grouped), an advantage of good spatial and temporal resolution around the central axis 630 will be realized, because the radial shifting concentrates data collection close to the central axis 630, as shown, for example, in FIG. 6. The central axis 630 can be aligned with critical areas of the area of interest to help ensure satisfactory imaging.

Figure 7:
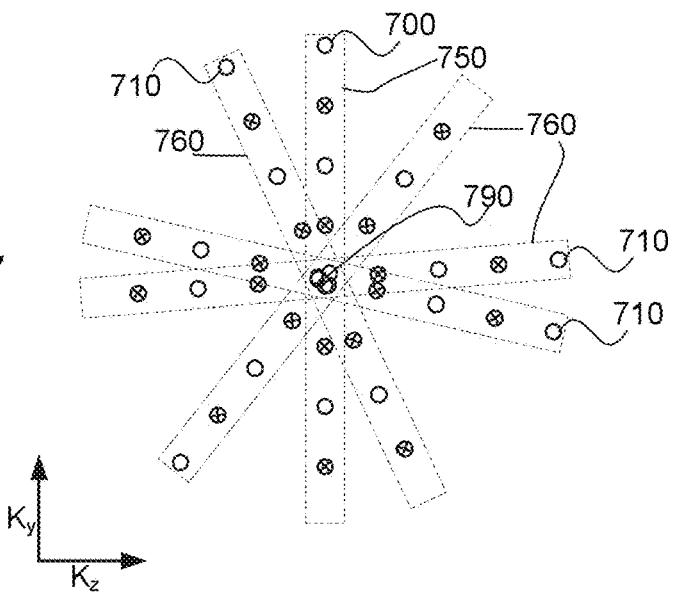
FIG. 7 is a view of a first hybrid Cartesian-radial k-space acquisition, consistent with some of the disclosed embodiments.
Figure 8:
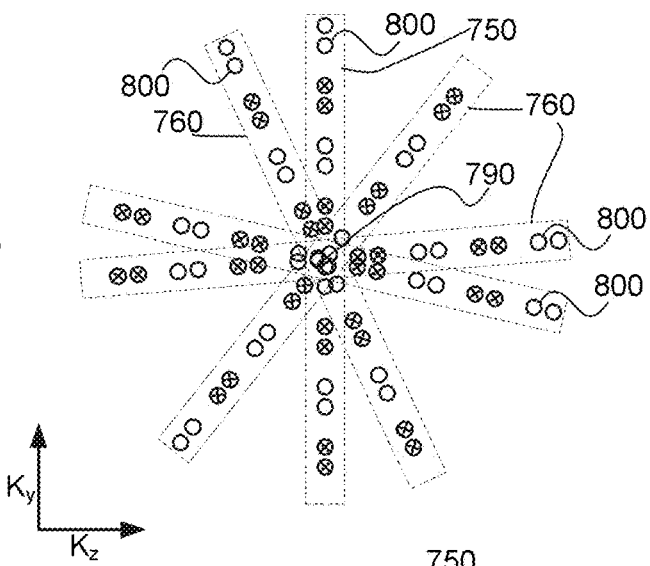
FIG. 8 is a view of a second hybrid Cartesian-radial k-space acquisition, consistent with some of the disclosed embodiments.
Figure 9:
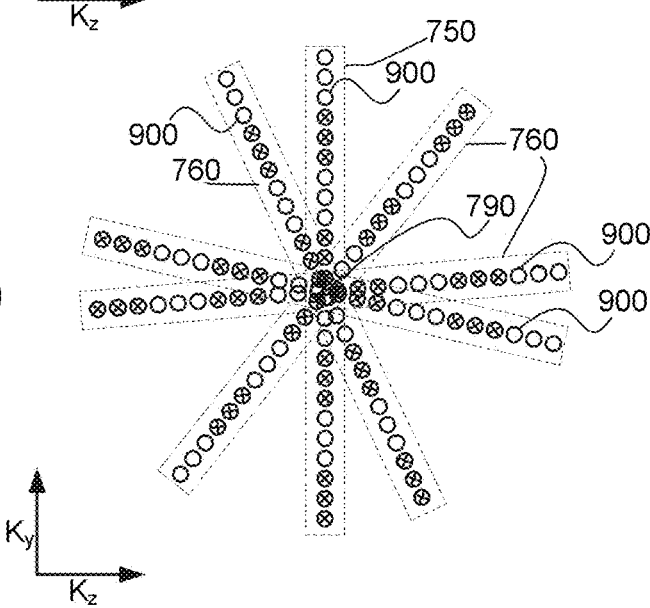
FIG. 9 is a view of a third hybrid Cartesian-radial k-space acquisition, consistent with some of the disclosed embodiments.

FIGS. 7, 8, and 9 include views illustrating an example k-space acquisition process. The process includes performing a sequence of k-space acquisitions, three of which being respectively illustrated in FIGS. 7, 8, and 9. Steps in the process adds projections to a spoke. Each spoke is aligned with a plane. The planes are rotated or shifted in a radial direction, while maintaining a parallel orientation to the frequency-encoding ($K_x$) direction.

FIG. 7 is an illustration of an exemplary first k-space acquisition. The first k-space acquisition includes the MRI system 100 acquiring a two-dimensional echo planar imaging (EPI) projection 700 in a first plane 750 parallel to the frequency-encoding direction. The projection 700 is similar to the projection 300 shown in FIGS. 3A and 3B. In particular, the projection 700 is a two-dimensional EPI data collection sequence that follows a zig-zag pattern that collects data at multiple coordinates throughout the plane 750. The projection 700 passes through a center axis 790.

The first acquisition further includes the MRI system 100 acquiring additional two-dimensional EPI projections 710 in planes 760 that are radially shifted about the center axis 790 with respect to the first plane 750. The planes 760 are sequentially shifted from the first plane 750 using a constant or variable increment. For example, the MRI system 100 may implement a golden angle shift from the first plane to the second plane, from the second plane to the third plane, from the third plane to the fourth plane, and so on. The first k-space acquisition may continue until a selected number of radially-shifted projections are collected. After the first k-space acquisition, the MRI system 100 may continue with one or more subsequent k-space acquisitions to further fill out the k-space and improve the spatial resolution of the data.

FIG. 8 is an illustration of the result of a second k-space acquisition. The second k-space acquisition includes the MRI system 100 acquiring an additional set of two-dimensional EPI projections 800 in all of the planes 750, 760 in which an EPI projection 700, 710 was acquired during the first k-space acquisition. However, each additional set of EPI projections 800 is shifted within a respective plane 750, 760 with respect to the projections 700, 710 previously acquired. The MRI system 100 may, for example, adjust phase-encoding and/or slab-encoding parameters in order to perform the shift within the $K_y$-$K_z$ dimension. The projections 800 thus fill in k-space between the $K_x$ traversals of the projections 700, 710, much like the projections 300, 310 previously described.

FIG. 9 is an illustration of the result of a third k-space acquisition. The third k-space acquisition is similar to the second k-space acquisition in that the MRI system acquires an additional set of two-dimensional EPI projections 900 in all of the planes 750, 760 in which an EPI projection 700, 710 was acquired during the first k-space acquisition. The MRI system 100 performs an additional shift within the respective planes 750, 760 in order to overlap the projections 900 with the projections 700, 710, and 800, thereby filling in additional k-space.

The k-space traversal process illustrated in FIGS. 7-9 is an example of the hybrid Cartesian-radial trajectory of the present disclosure. While only four "spokes" (the combination of projections in the planes 710, 750) are shown for clarity, it should be understood that any number of spokes may be chosen to thoroughly fill the k-space. For example, the MRI system may use 100 or more spokes. The number of spokes may be chosen based on a desired balance between spatial and temporal resolution. Moreover, while three projections per spoke are shown, it should be understood that embodiments are not limited to three, but may include any appropriate number of k-space acquisitions that each add a projection to a respective spoke to fill k-space. The collected data may be used to reconstruct an image at any point during the data collection process. For example, the MRI system may use a Fourier transform to reconstruct an image based on the data.

The disclosed exemplary hybrid Cartesian-radial k-space trajectory including the separate k-space acquisitions provides several advantages. For example, each acquisition can be performed quickly, especially due to the radial portion of the trajectory. Further, as the projections of each spoke encompass most or all of the associated plane within the target of interest, a low spatial resolution image may be produced, even before or while the subsequent k-space acquisitions are performed. The low spatial resolution image can be used for motion correction between the acquisitions. For example, the MRI system 100 may co-register a first set of projections (e.g., projections 700, 710) acquired during the first k-space acquisition with a second set of projections (e.g., projections 800) acquired during a subsequent k-space acquisition. Based on the co-registration of the coordinates associated with the different projections, especially near the center axis 790, the MRI system can adjust a subsequent k-space acquisition to compensate for motion of the subject.

Another example of an application of the disclosed hybrid Cartesian-radial trajectory is in MRI temperature monitoring. The MRI system 100 may be configured to measure temperature by calculating a proton resonance frequency temperature change associated with the data collected in the k-space trajectory. Based on the proton frequency measurements, the MRI system 100 may generate a three-dimensional temperature difference map based on each proton resonance frequency change.

The sequential k-space acquisitions are particularly suitable to being used in a sliding window temperature monitoring scheme because each acquisition provides a quick update across the entire field of view. Each projection can be compared to a previous projection collected at the same coordinate to continuously update a baseline temperature measurement and produce a real-time temperature map to monitor during a thermal therapy procedure (e.g., FUS).

Figure 10A:
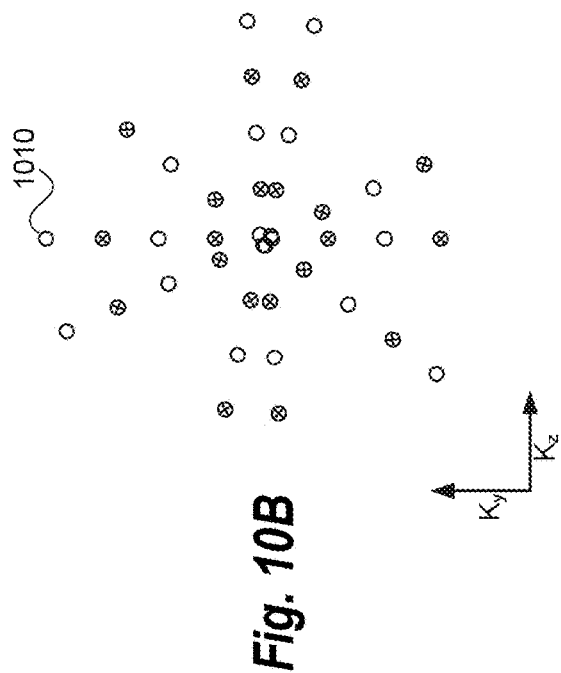
FIG. 10A is a view of a baseline temperature measurement, consistent with some of the disclosed embodiments.
Figure 10B:
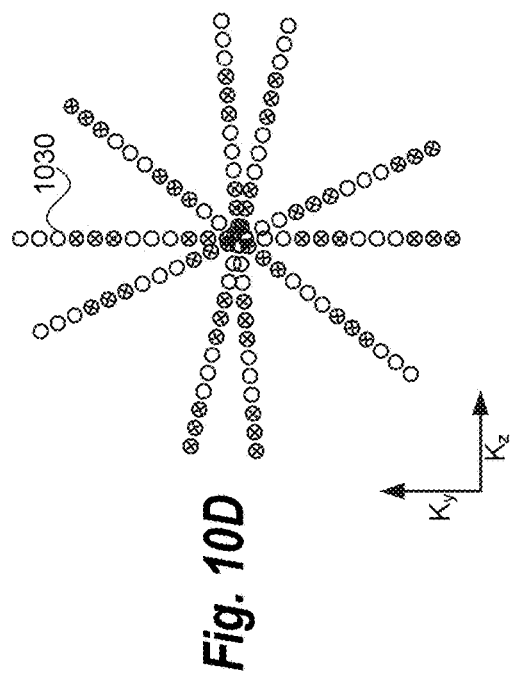
FIG. 10B is a view of a first temperature monitoring k-space acquisition, consistent with some of the disclosed embodiments.
Figure 10C:
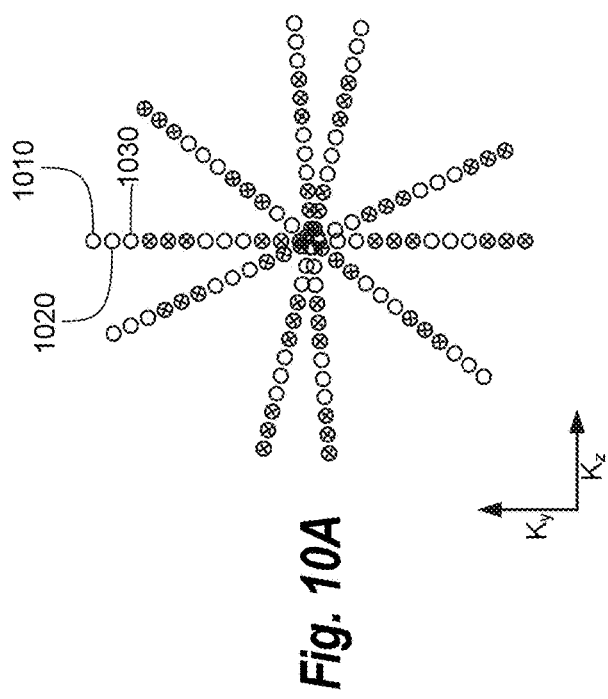
FIG. 10C is a view of a second temperature monitoring k-space acquisition, consistent with some of the disclosed embodiments.

FIGS. 10A, 10B, 10C, and 10D is an illustration of an exemplary temperature monitoring procedure. In FIG. 10A, the MRI system 100 creates a baseline temperature measurement by sampling k-space to obtain three-dimensional k-space data related to an area of interest of the subject. The baseline temperature measurement includes, for example, the process described with respect to FIGS. 7-9 in which three k-space acquisitions are performed. Each k-space acquisition includes the MRI system 100 acquiring two-dimensional EPI projections 1010, 1020, 1030 in a plurality of respective radially-offset planes. For example, projections 1010 may be acquired during a first acquisition, projections 1020 may be acquired during a second acquisition, and projections 1030 may be acquired during a third acquisition. Each two-dimensional EPI projection 1010, 1020, 1030 is offset from each other two-dimensional projection within a respective common plane. The MRI system 100 is configured to calculate a first proton resonance frequency value for each coordinate making up each of the projections 1010, 1020, 1030. In this way, the MRI system establishes a baseline temperature measurement. This measurement is taken before thermal therapy begins.

Figure 10D:
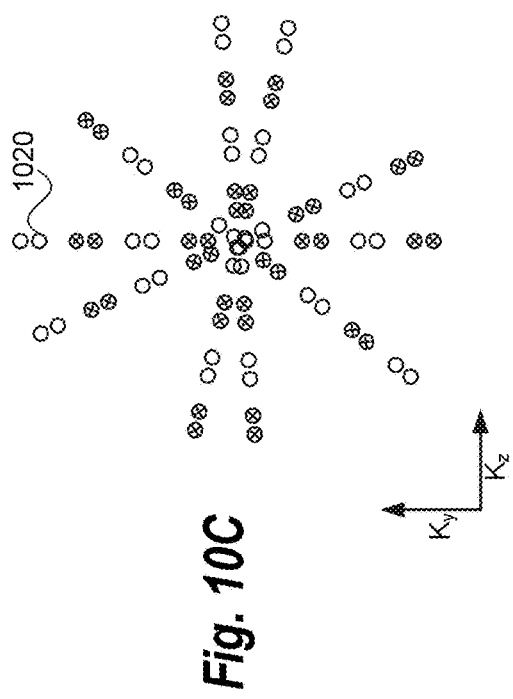
FIG. 10D is a view of a third temperature monitoring k-space acquisition, consistent with some of the disclosed embodiments.

After the baseline is measured, thermal therapy (e.g., FUS) may begin and the MRI system 100 begins performing a temperature monitoring procedure to monitor the area of interest for any undesirable changes in temperature. The temperature monitoring procedure includes repeating the series of k-space acquisitions performed during the baseline measurement. For example, the MRI system 100 may first data associated with the projections 1010 (FIG. 10B), followed by the projections 1020 (FIG. 10C), and finally the projections 1030 (FIG. 10D).

After each acquisition, the MRI system 100 is configured to calculate a proton resonance frequency value for each coordinate making up each of the projections. The MRI system 100 compares the proton resonance frequency value to the baseline proton resonance frequency value for each coordinate and generates a temperature difference map based on the comparison. In some embodiments, the MRI system 100 may update the baseline measurement with the newly-acquired data and continue subsequent measurements until the thermal therapy is completed.

Figure 11:
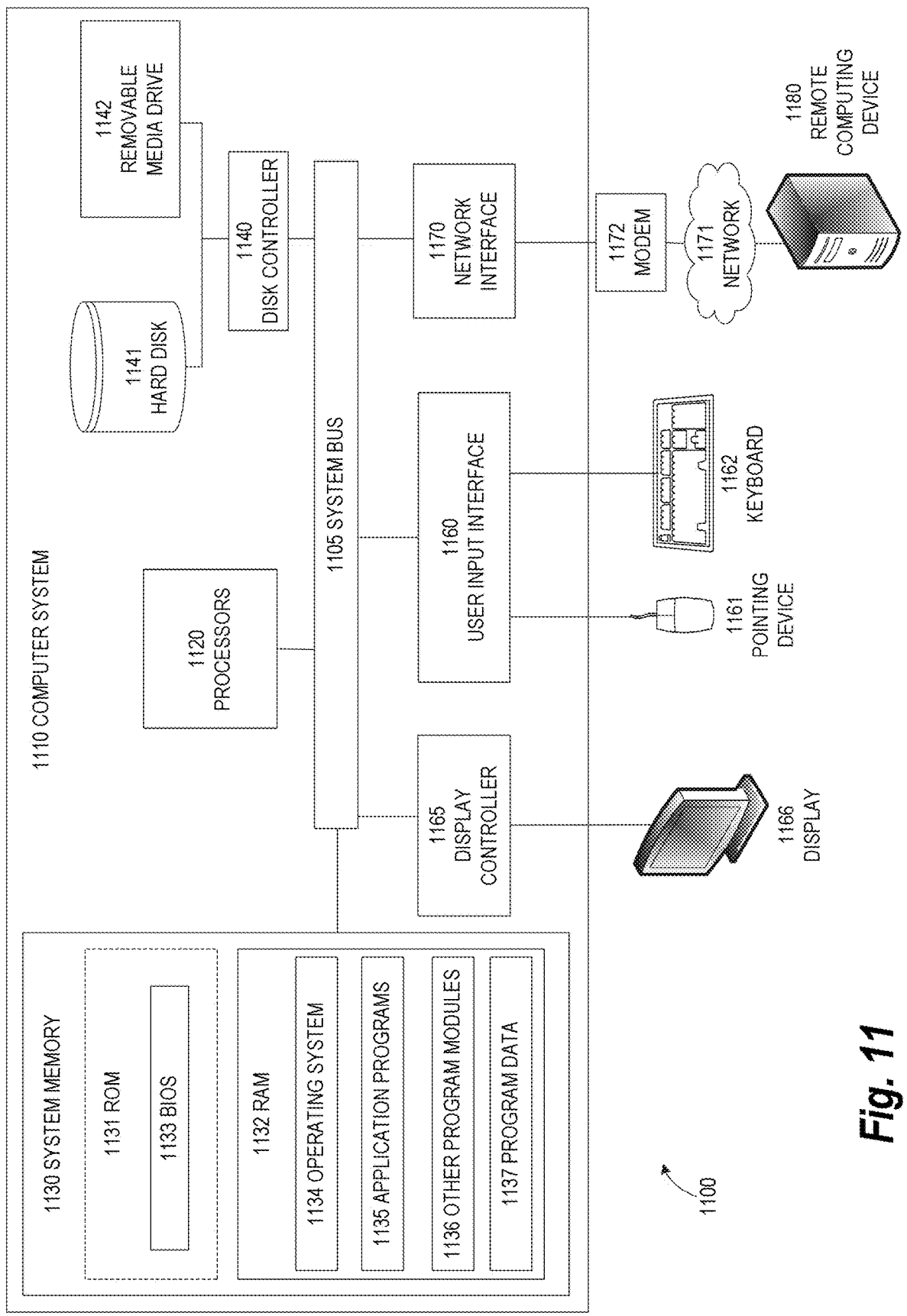
FIG. 11 illustrates an exemplary computing environment within which some of the disclosed embodiments may be implemented.

FIG. 11 illustrates an exemplary computing environment 1100 within which embodiments of the invention may be implemented. For example, this computing environment 1100 may be configured to execute an imaging process performed by the MRI system 100. The computing environment 1100 may include computer system 1110, which is one example of a computing system upon which embodiments of the invention may be implemented. Computers and computing environments, such as computer system 1110 and computing environment 1100, are known to those of skill in the art and thus are described briefly here.

As shown in FIG. 11, the computer system 1110 may include a communication mechanism such as a bus 1105 or other communication mechanism for communicating information within the computer system 1110. The computer system 1110 further includes one or more processors 1120 coupled with the bus 1105 for processing the information. The processors 1120 may include one or more central processing units (CPUs), graphical processing units (GPUs), or any other processor known in the art.

The computer system 1110 also includes a system memory 1130 coupled to the bus 1105 for storing information and instructions to be executed by processors 1120. The system memory 1130 may include computer readable storage media in the form of volatile and/or nonvolatile memory, such as read only memory (ROM) 1131 and/or random access memory (RAM) 1132. The system memory RAM 1132 may include other dynamic storage device(s) (e.g., dynamic RAM, static RAM, and synchronous DRAM). The system memory ROM 1131 may include other static storage device(s) (e.g., programmable ROM, erasable PROM, and electrically erasable PROM). In addition, the system memory 1130 may be used for storing temporary variables or other intermediate information during the execution of instructions by the processors 1120. A basic input/output system (BIOS) 1133 containing the basic routines that help to transfer information between elements within computer system 1110, such as during start-up, may be stored in ROM 1131. RAM 1132 may contain data and/or program modules that are immediately accessible to and/or presently being operated on by the processors 1120. System memory 1130 may additionally include, for example, operating system 1134, application programs 1135, other program modules 1136 and program data 1137.

The computer system 1110 also includes a disk controller 1140 coupled to the bus 1105 to control one or more storage devices for storing information and instructions, such as a hard disk 1141 and a removable media drive 1142 (e.g., floppy disk drive, compact disc drive, tape drive, and/or solid state drive). The storage devices may be added to the computer system 1110 using an appropriate device interface (e.g., a small computer system interface (SCSI), integrated device electronics (IDE), Universal Serial Bus (USB), or FireWire).

The computer system 1110 may also include a display controller 1165 coupled to the bus 1105 to control a display 1166, such as a cathode ray tube (CRT) or liquid crystal display (LCD), for displaying information to a computer user. The computer system 1110 includes an input interface 1160 and one or more input devices, such as a keyboard 1162 and a pointing device 1161, for interacting with a computer user and providing information to the processor 1120. The pointing device 1161, for example, may be a mouse, a trackball, or a pointing stick for communicating direction information and command selections to the processor 1120 and for controlling cursor movement on the display 1166. The display 1166 may provide a touch screen interface which allows input to supplement or replace the communication of direction information and command selections by the pointing device 1161.

The computer system 1110 may perform a portion or all of the processing steps of embodiments of the invention in response to the processors 1120 executing one or more sequences of one or more instructions contained in a memory, such as the system memory 1130. Such instructions may be read into the system memory 1130 from another computer readable medium, such as a hard disk 1141 or a removable media drive 1142. The hard disk 1141 may contain one or more datastores and data files used by embodiments of the present invention. Datastore contents and data files may be encrypted to improve security. The processors 1120 may also be employed in a multi-processing arrangement to execute the one or more sequences of instructions contained in system memory 1130. In alternative embodiments, hard-wired circuitry may be used in place of or in combination with software instructions. Thus, embodiments are not limited to any specific combination of hardware circuitry and software.

As stated above, the computer system 1110 may include at least one computer readable medium or memory for holding instructions programmed according to embodiments of the invention and for containing data structures, tables, records, or other data described herein. The term "computer readable medium" as used herein refers to any medium that participates in providing instructions to the processor 1120 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 1141 or removable media drive 1142. Non-limiting examples of volatile media include dynamic memory, such as system memory 1130. Non-limiting examples of transmission media include coaxial cables, copper wire, and fiber optics, including the wires that make up the bus 1105. Transmission media may also take the form of acoustic or light waves, such as those generated during radio wave and infrared data communications.

The computing environment 1100 may further include the computer system 1110 operating in a networked environment using logical connections to one or more remote computers, such as remote computer 1180. Remote computer 1180 may be a personal computer (laptop or desktop), a mobile device, a server, a router, a network PC, a peer device or other common network node, and typically includes many or all of the elements described above relative to computer system 1110. When used in a networking environment, computer system 1110 may include modem 1172 for establishing communications over a network 1171, such as the Internet. Modem 1172 may be connected to bus 1105 via user network interface 1170, or via another appropriate mechanism.

Network 1171 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 1110 and other computers (e.g., remote computer 1180). The network 1171 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 1171.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f) unless the element is expressly recited using the phrase "means for."

The invention claimed is:

1. A method for generating an image of a subject using a magnetic resonance imaging (MRI) system and a hybrid Cartesian-radial k-space trajectory, comprising: sampling k-space to obtain three-dimensional k-space data related to an area of interest of the subject, comprising: performing a first k-space acquisition, comprising: acquiring a two-dimensional echo planar imaging (EPI) projection in a first plane parallel to a frequency-encoding direction; acquiring additional two-dimensional EPI projections in planes that are radially shifted about a center axis parallel to the frequency-encoding direction with respect to the first plane, until a selected number of projections are acquired; performing at least one subsequent k-space acquisition, comprising: acquiring an additional set of two-dimensional EPI projections in all of the planes in which an EPI projection was acquired during the first k-space acquisition, each additional set of EPI projections being shifted within a respective plane with respect to any previous projections acquired in that plane; and reconstructing the three-dimensional k-space data into an image of the area of interest.

2. The method of claim 1, wherein sampling k-space includes performing at least two subsequent k-space acquisitions.

3. The method of claim 2, wherein sampling k-space includes performing two subsequent k-space acquisitions.

4. The method of claim 1, wherein the planes that are radially shifted with respect to the first plane are sequentially shifted by a golden angle increment.

5. The method of claim 1, further comprising, for each k-space acquisition, calculating a proton resonance frequency temperature change.

6. The method of claim 5, wherein reconstructing the three-dimensional k-space data into an image of the area of interest includes generating a three-dimensional temperature difference map based on each proton resonance frequency change.

7. The method of claim 1, further comprising performing a motion correction between the first k-space acquisition and the at least one subsequent k-space acquisition.

8. The method of claim 7, wherein performing the motion correction comprises co-registering a first set of projections acquired during the first k-space acquisition with a second set of projections acquired during a subsequent k-space acquisition.

9. The method of claim 1, wherein each EPI projection includes a TE such that the image of the area of interest is T2*-weighted.

10. A system for performing magnetic resonance imaging (MRI) of a subject using a hybrid Cartesian-radial k-space trajectory, the system comprising: a plurality of imaging coils comprising: a plurality of gradient coils, and a plurality of radio-frequency (RF) coils; and a central control computer configured to: sample k-space to obtain three-dimensional k-space data related to an area of interest of the subject, comprising: performing a first k-space acquisition, comprising: acquiring a two-dimensional echo planar imaging (EPI) projection in a first plane parallel to a frequency-encoding direction; acquiring additional two-dimensional EPI projections in planes that are radially shifted about a center axis parallel to the frequency-encoding direction with respect to the first plane, until a selected number of projections are acquired; performing at least one subsequent k-space acquisition, comprising: acquiring an additional set of two-dimensional EPI projections in all of the planes in which an EPI projection was acquired during the first k-space acquisition, each additional set of EPI projections being shifted within a respective plane with respect to any previous projections acquired in that plane; and reconstruct the three-dimensional k-space data into an image of the area of interest.

11. The system of claim 10, wherein sampling k-space includes performing at least two subsequent k-space acquisitions.

12. The system of claim 10, wherein the planes that are radially shifted with respect to the first plane are sequentially shifted by a golden angle increment.

13. The system of claim 10, further comprising, for each k-space acquisition, calculating a proton resonance frequency temperature change.

14. The system of claim 13, wherein reconstructing the three-dimensional k-space data into an image of the area of interest includes generating a three-dimensional temperature difference map based on each proton resonance frequency change.

15. The system of claim 10, wherein the central control computer is further configured to perform a motion correction between the first k-space acquisition and the at least one subsequent k-space acquisition.

16. The system of claim 15, wherein performing the motion correction comprises co-registering a first set of projections acquired during the first k-space acquisition with a second set of projections acquired during a subsequent k-space acquisition.

17. The system of claim 10, wherein each EPI projection includes a TE such that the image of the area of interest is T2*-weighted.

* * * * *